(12) United States Patent
Okamoto

(10) Patent No.: US 6,249,457 B1
(45) Date of Patent: Jun. 19, 2001

(54) NONVOLATILE MEMORY DEVICE AND INSPECTION METHOD THEREFOR

(75) Inventor: Yuji Okamoto, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/401,272

(22) Filed: Sep. 23, 1999

(30) Foreign Application Priority Data

Sep. 28, 1998 (JP) .................................................. 10-273657

(51) Int. Cl.$^7$ .................................................. G11C 16/06
(52) U.S. Cl. ........................ 365/185.21; 365/185.09; 365/185.22; 365/185.2; 365/201; 365/189.09
(58) Field of Search ........................ 365/185.21, 185.09, 365/185.22, 185.2, 201, 189.09

(56) References Cited

U.S. PATENT DOCUMENTS

| | | | |
|---|---|---|---|
| 4,943,948 | * 7/1990 | Morton et al. | 365/201 |
| 5,091,888 | * 2/1992 | Akaogi | 365/210 |
| 5,142,496 | * 8/1992 | Van Buskirk | 365/201 |
| 5,386,388 | 1/1995 | Atwood et al. | 365/201 |
| 5,463,586 | 10/1995 | Chao et al. | 365/210 |
| 5,638,326 | * 6/1997 | Hollmer et al. | 365/185.2 |
| 5,673,221 | * 9/1997 | Calligaro et al. | 365/168 |
| 5,684,739 | * 11/1997 | Takeuchi | 365/185.03 |
| 5,768,191 | * 6/1998 | Choi et al. | 365/185.22 |
| 5,953,253 | * 9/1999 | Devin et al. | 365/185.22 |

FOREIGN PATENT DOCUMENTS 1-300499   12/1989   (JP) .
3-22860    1/1991    (JP) .

* cited by examiner

Primary Examiner—David Nelms
Assistant Examiner—Connie C. Yoha
(74) Attorney, Agent, or Firm—Sughrue, Mion, Zinn, Macpeak & Seas, PLLC

(57) ABSTRACT

A nonvolatile memory device for which an endurance test can be performed in a short time without requiring an apparatus for exclusive use for generating a reference current. The nonvolatile memory includes a memory cell for holding binary data and outputting, upon reading therefrom, first current or second current which is lower than the first current in response to the binary data, a reference circuit for generating reference current lower than the first current but higher than the second current, a sense amplifier for comparing the output current of the memory cell with the reference current to reproduce binary data, and a reference switching circuit for selectively switching the reference current to be generated by the reference circuit to a normal current, a higher current which is higher than the normal current or a lower current which is lower than the normal current.

3 Claims, 9 Drawing Sheets

NONVOLATILE MEMORY DEVICE AND INSPECTION METHOD THEREFOR

BACKGROUND OF THE INVENTION

1. Field of the Invention

This invention relates to a semiconductor nonvolatile memory device such as an EEPROM (Electrically Erasable Programmable Read Only Memory) device or a flash memory device, and a memory inspection method for inspecting a nonvolatile memory device.

2. Description of the Prior Art

Computer systems such as microcomputers are used for various applications at present, and semiconductor nonvolatile memory devices such as an EEPROM and a flash memory are used frequently as information storage media for the computer systems. A nonvolatile memory allows temporary storage of digital data and updating of the stored digital data and can maintain the stored data even when no electric power is supplied.

An example of a nonvolatile memory will be described below with reference to FIGS. 1 and 2. FIG. 1 shows a general structure of an EEPROM which is a kind of non-volatile memory, and FIG. 2 shows a memory cell array of the EEPROM.

EEPROM 100 as an example of a nonvolatile memory includes a multiplicity of memory cells 101 arranged in a two-dimensional structure wherein memory cells 101 are connected in a matrix in X and Y directions as a whole as shown in FIG. 2. A plurality of X selector transistors 102 and a plurality of Y selector transistors 103 are connected in a matrix to the multiplicity of memory cells 101. X/Y selector transistors 102, 103 are provided to select memory cells 101 one by one.

Each memory cell 101 stores and holds respective binary data and assumes a first state in response to write data "1" which is one of the binary data, but assumes a second state in response to erase data "0" which is the other of the binary data. Passing current through memory cell 101 is relatively high write current when memory cell 101 is in the first state, but is relatively low erase current when memory cell 101 is in the second state. The difference between the first and second states is provided, for example, by a difference in threshold voltage of the memory cell which corresponds to the amount of charge injected into the floating gate of the memory cell. The charge injected in the floating gate does not change in an ordinary condition, and this allows memory cells 101 to function as a nonvolatile memory.

EEPROM 100 includes a writing and erasing circuit (not shown) which controls memory cell 101 into the write state (first state) in response to an input of write data "1", but controls memory cell 101 into the erase state (second state) in response to an input of erase data "0".

EEPROM 100 further includes sense amplifier 104, to which memory cells 101 are connected through respective Y selector transistors 103. Also reference circuit 105 for generating a reference voltage is connected to sense amplifier 104. Reference circuit 105 includes a plurality of transistors, and sense amplifier 104 includes a plurality of transistors similarly.

Reference circuit 105 includes first transistor 111 to the gate electrode of which external bias power supply 120 is connected. Second transistor 112 is connected in series to first transistor 111. Second transistor 112 cooperates with third transistor 113 to form first current mirror circuit 121, and fourth transistor 114 is connected in series to transistor 113 of first current mirror circuit 121.

Second current mirror circuit 122 is formed from fourth transistor 114 of reference circuit 105 and first transistor 115 of sense amplifier 104. Second transistor 116 of sense amplifier 104 is connected in series to transistor 115 of second current mirror circuit 122.

Third current mirror circuit 123 is formed, in sense amplifier 104, from second transistor 116 and third transistor 117, and transistor 117 of third current mirror circuit 123 is connected to memory cells 101 through respective Y selector transistors 103 connected in parallel to each other.

Bias power supply 120 supplies a gate voltage to first transistor 111 of reference circuit 105, and a fixed drain current flows through first transistor 111. Since first to third current mirror circuits 121 to 123 are successively connected to this first transistor 111, reference circuit 105 after all supplies reference current corresponding to the drain. current of first transistor 111 to sense amplifier 104.

Reference circuit 105 generates the reference current as described above. The reference current is higher than erase current which is pass current of memory cell 101 in an erase state, but is lower than write current which is pass current of memory cell 101 in a write state. Sense amplifier 104 compares pass current of memory cell 101 with the reference current of reference circuit 105 and reproduces the binary data stored in memory cell 101 based on a result of the comparison.

EEPROM 100 having the structure described above can execute three operations of data writing, data erasure and data reproduction arbitrarily. In execution of data writing into EEPROM 100, the writing and erasing circuit selectively controls one of the multiplicity of memory cells 101 to a write state in accordance with input data to record write data "1", which is one of the binary data, into selected memory cell 101.

In reproduction of the thus written data, reference circuit 105 generates the reference current, which is higher than the erase current but lower than write current, and sense amplifier 104 compares the pass current of memory cell 101 with the reference current thereby to reproduce binary data "0", "1".

In order to erase the written, data described above, the writing and erasing circuit selectively changes the state of memory cell 101 from the write state to the erase state in accordance with input data to initialize the written data "1" of memory cells 101 to the erase data "0".

While EEPROM 100 can execute the three operations of data writing, data erasure and data reproduction as described above, in order to control memory cell 101 to the write state or the erase state, a predetermined time is required as seen from FIG. 3. FIG. 3 is a characteristic diagram illustrating the on-currents upon reading of a memory cell of an EEPROM in a non-used state with respect to the write time and the erase time. The write time signifies a duration of a high voltage pulse applied to a memory cell in order to control the memory cell to the write state, and the erase time signifies a duration of a high voltage pulse applied to a memory cell in order to control the memory cell to the erase state. As apparently seen from FIG. 3, in order to obtain prescribed on-currents for the write state and the erase state when data is to be read out from a memory cell, a write time and an erase time longer than a certain time length are required. However, the write time and the erase time required to obtain the prescribed respective on-currents for the write state and the erase state are not constant, but increase as the accumulated number of times by which data writing and erasing operations into and from the EEPROM are performed increases. FIG. 4 is a characteristic diagram illustrating on-currents upon reading of a memory cell of the EEPROM, whose characteristic has been deteriorated as a result of an endurance test performed for the EEPROM, with respect to the write and erase times. The endurance test signifies a test of rewriting data into a memory cell in order to decide whether the EEPROM is a good product or not. FIG. 5 illustrates on-currents upon writing/erasure of a memory cell with respect to the number of times of data writing operations in the endurance test.

It is a normal practice to set the write time and the erase time for EEPROM 100 on the assumption that the times required for data writing and data erasure are invariable. Therefore, if the accumulated number of times of data writing operations and data erasing operations increases and memory cells 101 are deteriorated accordingly, then the write current upon data reading from the memory cell decreases and the erase current increases as seen from FIG. 5. Progress of the decrease of the write current or the increase of the erase current makes it difficult to reproduce binary data by comparison with the reference current, and EEPROM 100 is disabled finally.

Therefore, before shipment after EEPROM 100 is fabricated, the endurance test described above is executed to detect failed memory cell 101. In the endurance test, the write data "1" is first recorded into and then reproduced from memory cell 101, and if the reproduced data is not "1", then memory cell 101 is decided to be a failed memory cell. Further, the erase data "0" is first recorded into and then reproduced from memory cell 101, and if the reproduced data is not "0", then memory cell 101 is decided to be a failed memory cell. Before shipment of EEPROM 100, such a sequence of operations as described above is repeated by a predetermined number of times for all of memory cells 101 of EEPROM 100, and when the number of memory cells 101 decided to be failed memory cells with respect to all memory cells of EEPROM 100 is greater than a tolerance, this EEPROM 100 is abandoned. If the number of failed memory cells 101 remains within the tolerance, EEPROM 100 is set so as to disable use of all of failed memory cells 101, and then this EEPROM 100 is shipped. Since the endurance test described above is executed for EEPROM 100, EEPROM 100 can be shipped as a product which is free from an initial failure.

EEPROM 100 at present, however, includes a very large number of memory cells 101, and a certain time is required for data writing or data erasure into or from memory cell 101 as described above. Therefore, an endurance test in which data writing, data erasure and data reproduction for memory cells 101 are repeated by a predetermined number of times requires much time, and this deteriorates the productivity in fabrication of EEPROM 100.

A nonvolatile memory device which can solve the subject of the conventional nonvolatile memory described above is disclosed in Japanese Patent Laid-Open No. 300499/89 (JP, 01300499, A. In the improved nonvolatile memory, external reference current is supplied to a sense amplifier to allow reproduction of write data with reference current of a level higher than a normal level or allow reproduction of erase data with reference current of another level lower than the normal level. When such an endurance test is executed for the nonvolatile memory, a memory cell can be tested with a reduced margin of current. Consequently, a failed memory cell can be detected rapidly and the endurance test can be completed in a reduced time. However, in order to use the method described above to execute an endurance test, it is required to produce the reference current having a higher or lower level and externally supply it to the nonvolatile memory, and an apparatus for exclusive use for generating and supplying the variable current must be prepared separately from the nonvolatile memory.

Japanese Patent Laid-Open No. 22860/91 (JP, 03022860, A) discloses another nonvolatile memory device which includes a built-in high voltage generation circuit which generates a high voltage to be used for a test of the nonvolatile memory. The high voltage generation circuit can generate and supply three or more different high voltages.

SUMMARY OF THE INVENTION

It is an object of the present invention to provide a nonvolatile memory device for which an endurance test can be performed in a short time without requiring an apparatus for exclusive use for generating current.

It is another object of the present invention to provide an inspection method for a nonvolatile memory device which can complete an endurance test in a short time without requiring an apparatus for exclusive use for generating current.

In accordance with a first aspect of the present invention, there is provided a nonvolatile memory device which comprises data holding means for holding binary data and outputting, upon reading therefrom, a first value of an electrical quantity or a second value of the electrical quantity smaller than the first value in response to a value of the binary data, reference generation means for generating a reference value of the electric quantity smaller than the first value but larger than the second value, data reproduction means for comparing the output value of the data holding means with the reference value to reproduce binary data, and reference switching means for selectively switching the reference electric amount to be generated by the reference generation means to a normal reference value which is a value to be generated normally, a higher reference value which is higher than the first value or a lower reference value which is lower than the first value.

When the nonvolatile memory device is inspected, preferably the memory inspection method comprises the steps of changing the state of the data holding means to state corresponding to the first value, setting set the reference value to the higher value and reproducing the binary data held by the data holding means, and changing the state of the data holding means to another state corresponding to the second value, setting the reference value to the lower value and reproducing the binary data held by the data holding means.

The various means in the present invention are only required to be formed so as to implement respective functions and may be, for example, hardware for exclusive use, a computer to which appropriate functions are provided by a program, functions implemented in a computer by an appropriate program, and a suitable combinations of them.

In accordance with a second aspect of the present invention, there is provided a nonvolatile memory device which comprises a memory cell for holding binary data and outputting, upon reading therefrom, first current or second current which is lower than the first current in response to the binary data, a reference circuit for generating reference current lower than the first current but higher than the second current, a sense amplifier for comparing the output current of the memory cell with the reference current to reproduce binary data, and a reference switching circuit for selectively switching the reference current to be generated by the reference circuit to a normal current, a higher current which is higher than the normal current or a lower current which is lower than the normal current.

When the nonvolatile memory is inspected, preferably the memory inspection method comprises the steps of changing the state of the memory cell to a state corresponding to the first current, setting the reference current to the current higher than the normal current and reproducing the binary data held by the memory cell by means of the sense amplifier, and changing the state of the memory cell to another state corresponding to the second current, setting the reference current to the current lower than the normal current and reproducing the binary data held by the memory cell by means of the sense amplifier.

The above and other objects, features and advantages of the present invention will become apparent from the following description referring to the accompanying drawings which illustrate an example of a preferred embodiment of the present invention.

DESCRIPTION OF THE PREFERRED EMBODIMENT

Figure 1:
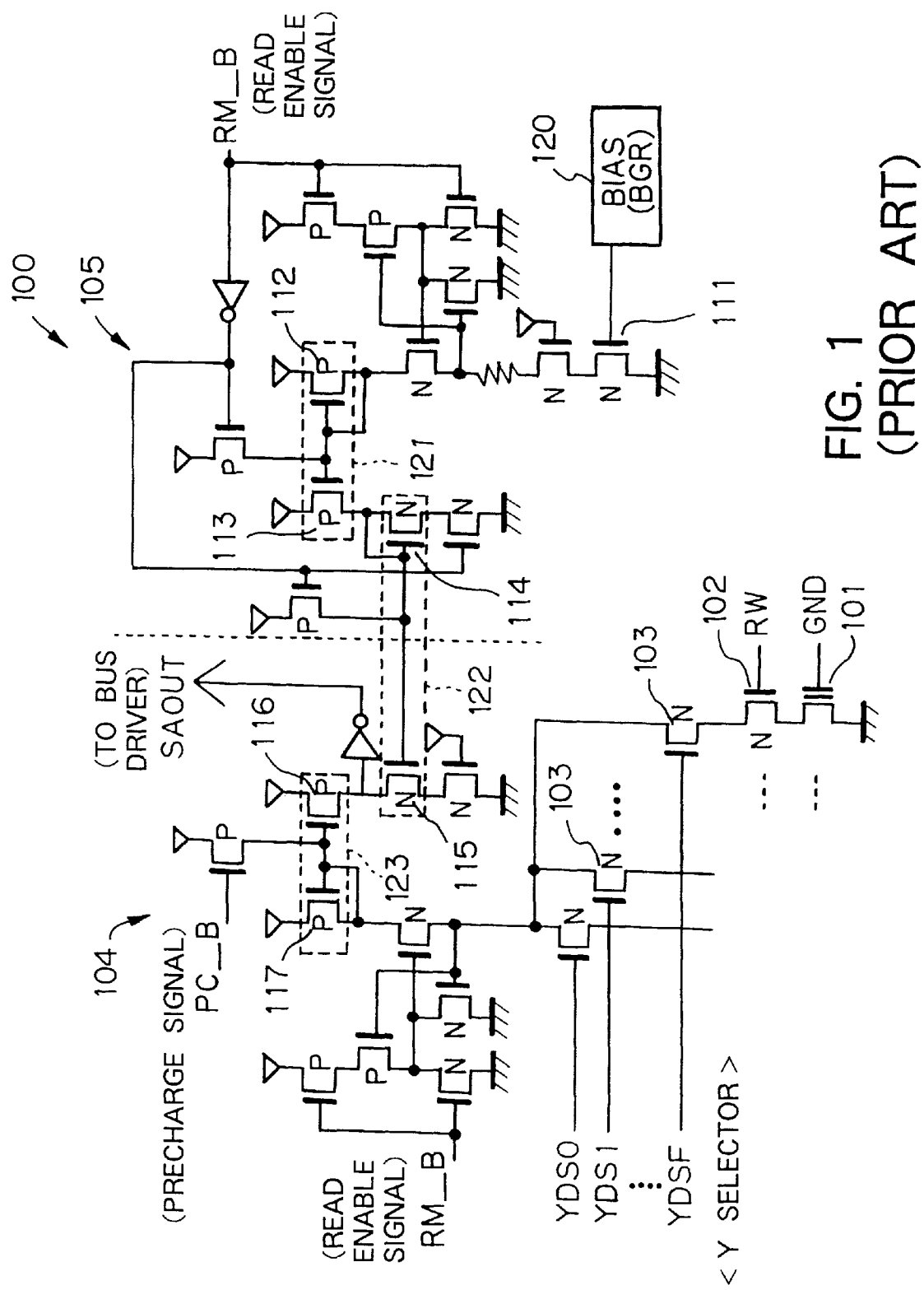
FIG. 1 is a circuit diagram showing a general structure of an EEPROM (Electrically Erasable Programmable Read Only Memory)
Figure 6:
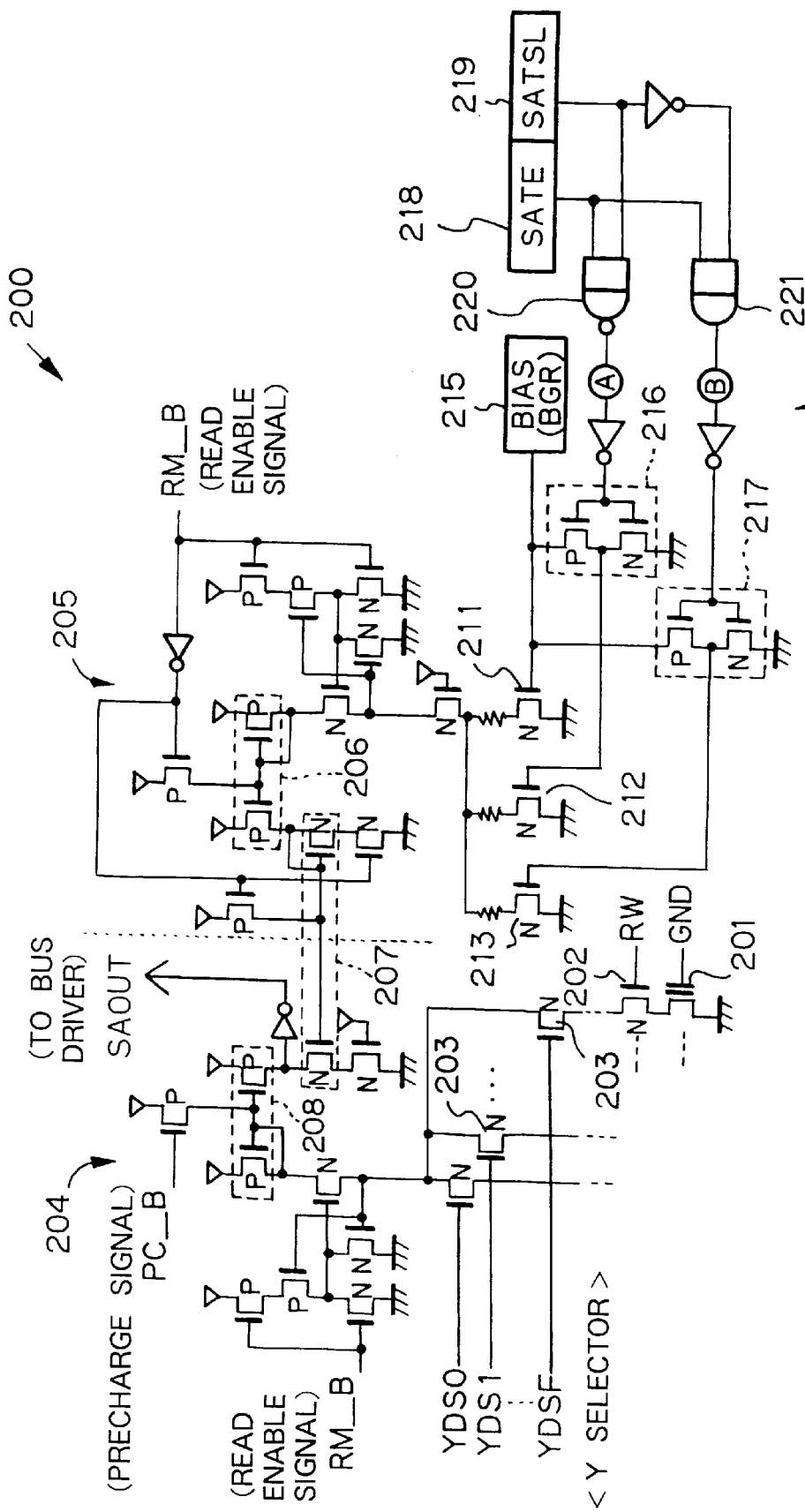
FIG. 6 is a circuit diagram showing an internal structure of an EEPROM according to a preferred embodiment of the present invention.

In a nonvolatile memory device shown in FIG. 6 according to a preferred embodiment of the present invention, the same elements to those of FIG. 1 described above are denoted by the same names and have the same functions and structures to those of FIG. 1.

Figure 2:
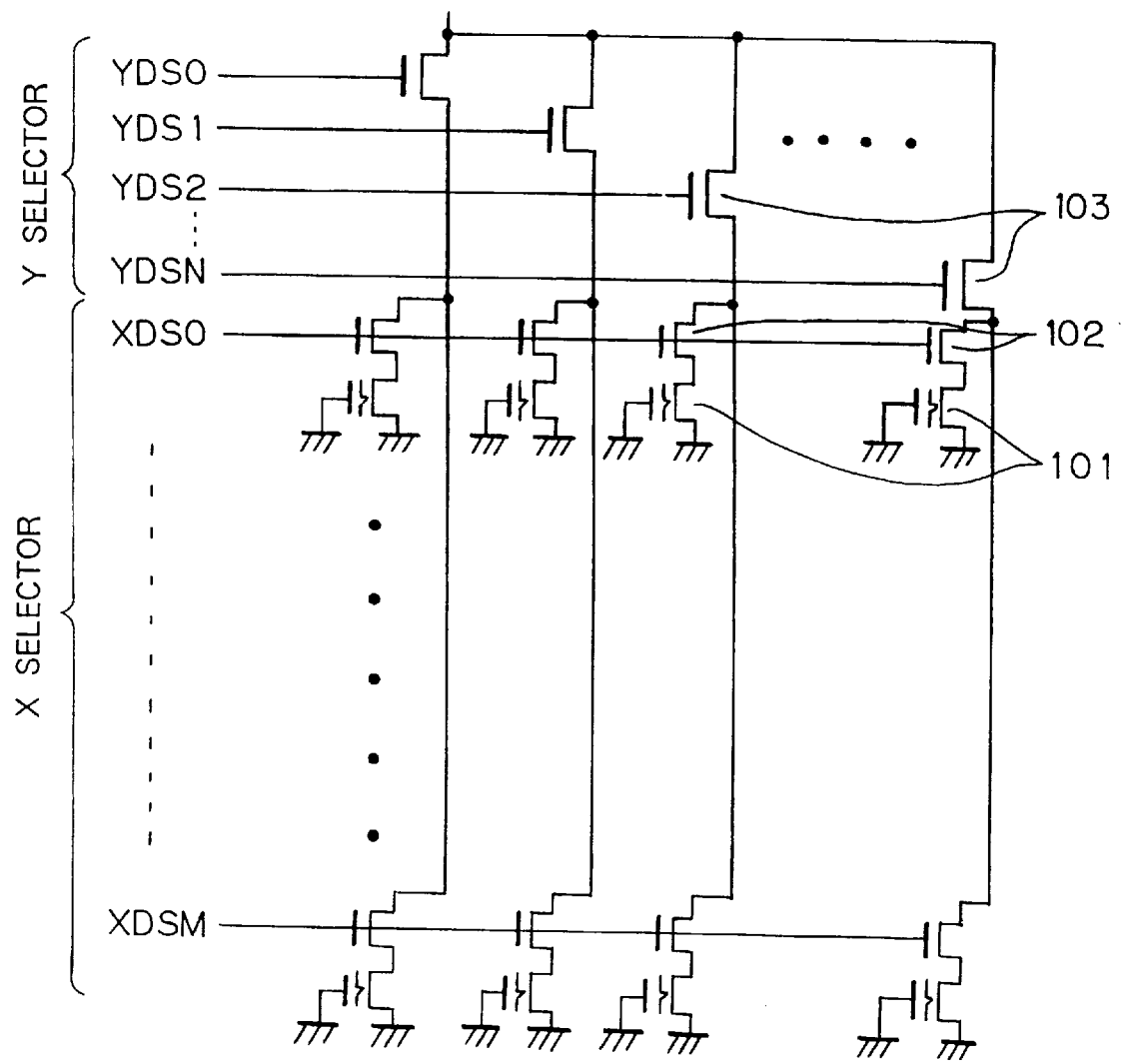
FIG. 2 is a circuit diagram showing a memory array of the EEPROM.
Figure 3:
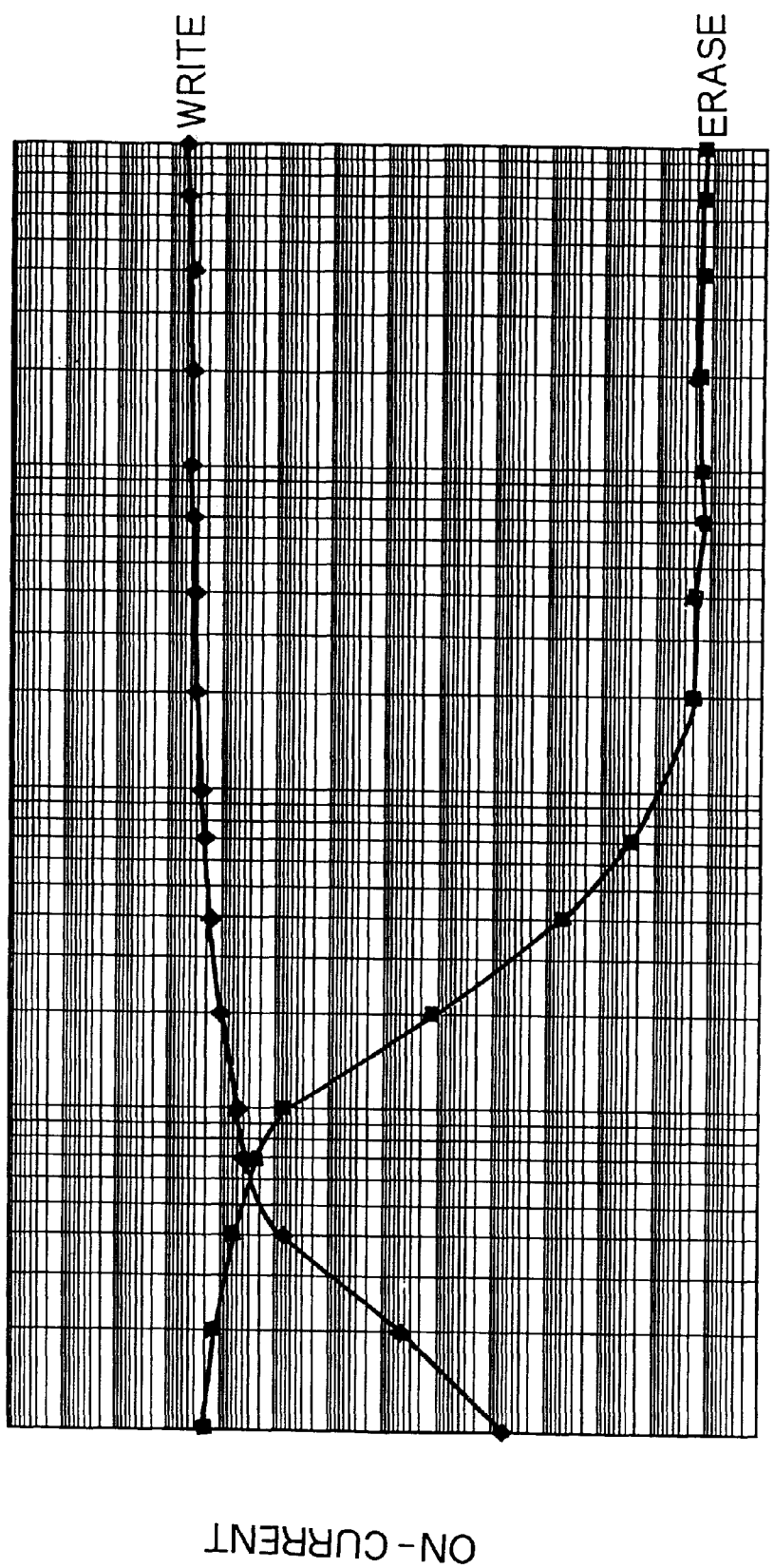
FIG. 3 is a characteristic diagram illustrating on-currents upon reading of a memory cell of an EEPROM in a non-used state with respect to the write and erase times.
Figure 4:
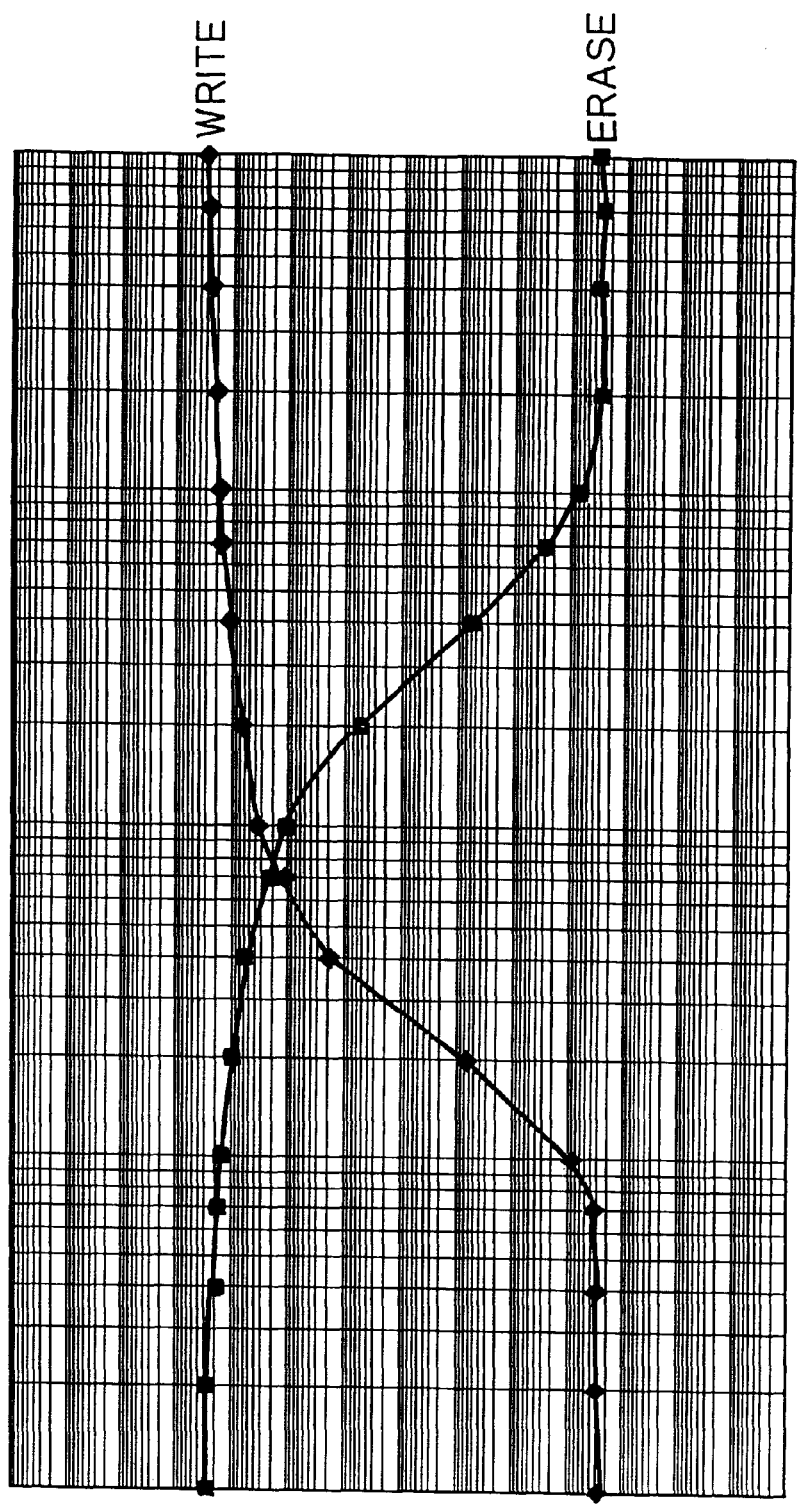
FIG. 4 is a characteristic diagram illustrating on-currents upon reading of a memory cell of an EEPROM, whose characteristic has been deteriorated by an endurance test performed for the EEPROM, with respect to the write and erase times.
Figure 5:
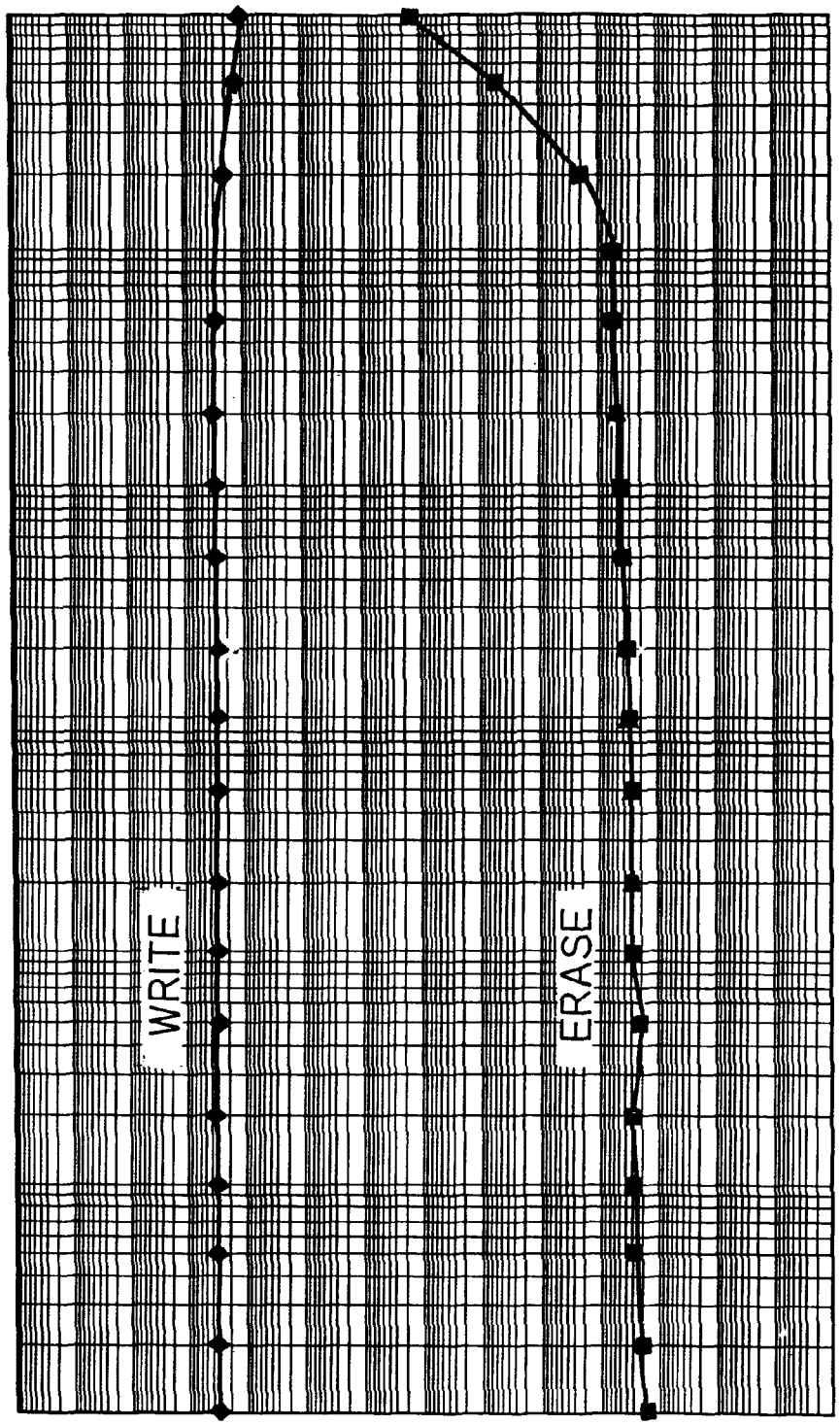
FIG. 5 is a characteristic diagram illustrating on-currents upon writing/erasure of Et memory cell with respect to the number of times of data writing operations in an endurance test performed for the EEPROM.

Also EEPROM 200 shown in FIG. 6 includes, similarly to conventional EEPROM 100 shown in FIG. 1, a multiplicity of memory cells 201 for individually holding 1-bit data. Memory cells 201 form a memory array similarly to those shown in FIG. 2, and X selector transistor 202 is provided for each memory cell 201 and Y selector transistor 203 is provided for each column.

Each memory cell 201 stores and holds binary data, and assumes a first state in response to write data "1" which is one of the binary data, but assumes a second state in response to erase data "0" which is the other of the binary data. Pass current of memory cell 201 is write current which is relatively high current when memory cell 201 is in the first state, but is erase current which is relatively low current when memory cell 201 is in the second state. EEPROM 200 includes a writing and erasing circuit (not shown), which controls memory cell 201 to the write state (first state) in response to an input of the write data "1" but to the erase state (second state) in response to an input of the erase data "0".

EEPROM 200 further includes sense amplifier 204 as shown in FIG. 6. The plurality of memory cells 201 are connected to sense amplifier 204 through respective Y selector transistors 203. Also reference circuit 205 for generating a reference voltage is connected to sense amplifier 204.

Sense amplifier 204 and reference circuit 205 include current mirror circuits 206 to 208 similarly as in EEPROM 100 shown in FIG. 1. Consequently, reference circuit 205 generates a reference current higher than the erase current but lower than the write current of memory cell 201, and sense amplifier 204 compares pass current (on-current) of memory cell 201 with the reference current of reference circuit 205 to reproduce binary data.

EEPROM 200 in the present embodiment, however, is different from EEPROM 100 shown in FIG. 1 in that it includes three transistors 211 to 213 connected in series as transistor elements connected in series to first current mirror circuit 206 for determining the reference current. The gates of transistors 211 to 213 are connected to reference switching circuit 214 for varying the reference current value. More particularly, the gate of first transistor 211 is connected to bias power supply 215, and bias power supply 215 is connected to the gates of second transistor 212 and third transistor 213 through changeover switches 216, 217 of reference switching circuit 214, respectively.

A pair of register circuits 218, 219 are connected to changeover switch 216 through NAND gate 220. Register circuits 218, 219 are connected also to changeover switch 217 through AND gate 221. Register circuits 218, 219 in pair individually hold binary flags externally inputted thereto, and also the states "A" and "B" of changeover switches 216, 217 vary in response to the binary flags held by register circuits 218, 219.

TABLE 1

| SATE | SATSL | A | B |
|------|-------|---|---|
| 0 | 0 | 1 | 0 |
| 0 | 1 | 1 | 0 |
| 1 | 0 | 1 | 1 |
| 1 | 1 | 0 | 0 |

"SATE" of Table 1 represents the binary flag for selection between a fixed mode and a variable mode of the reference current, and "SATSL" represents the binary flag for selection between higher/lower currents of the reference current.

Accordingly, when register circuit 218 holds "0" as the binary flag, changeover switch 216 connects bias power supply 215 to the gate of second transistor 212 and changeover switch 217 grounds the gate of third transistor 213 independently of the flag held by second register circuit 219. In this case, first and second transistors 211, 212 are controlled to an on-state and third transistor 213 is controlled to an off-state. Consequently, current equal to a steady-state current in the conventional nonvolatile memory is supplied from reference circuit 205 to sense amplifier 204. The current is referred to as normal current.

When the flag held by first register circuit 218 is "1" and the flag held by second register circuit 219 is "0", first and second changeover switches 216, 217 connect bias power supply 215 to the gates of both of second and third transistors 212, 213. In this case, all of first to third transistors 21.1 to 213 are controlled to an on-state, and consequently, the reference current of reference circuit 205 becomes higher than the normal current.

When the flag held by first register circuit 218 is "1" and the flag held by second register circuit 219 is "1", first and second changeover switches 216, 217 connect the gates of both of second and third transistors 212, to a ground terminal. In this case, only first transistor 211 is controlled to an on-state, and consequently, the reference current of reference circuit 205 becomes lower than the normal current.

Also EEPROM 200 of the present embodiment described above can execute three operations of data writing, data erasure and data reproduction arbitrarily similarly to conventional EEPROM 100 shown in FIG. 1. Also this EEPROM 200 is shipped after an endurance test is executed therefor.

Figure 7:
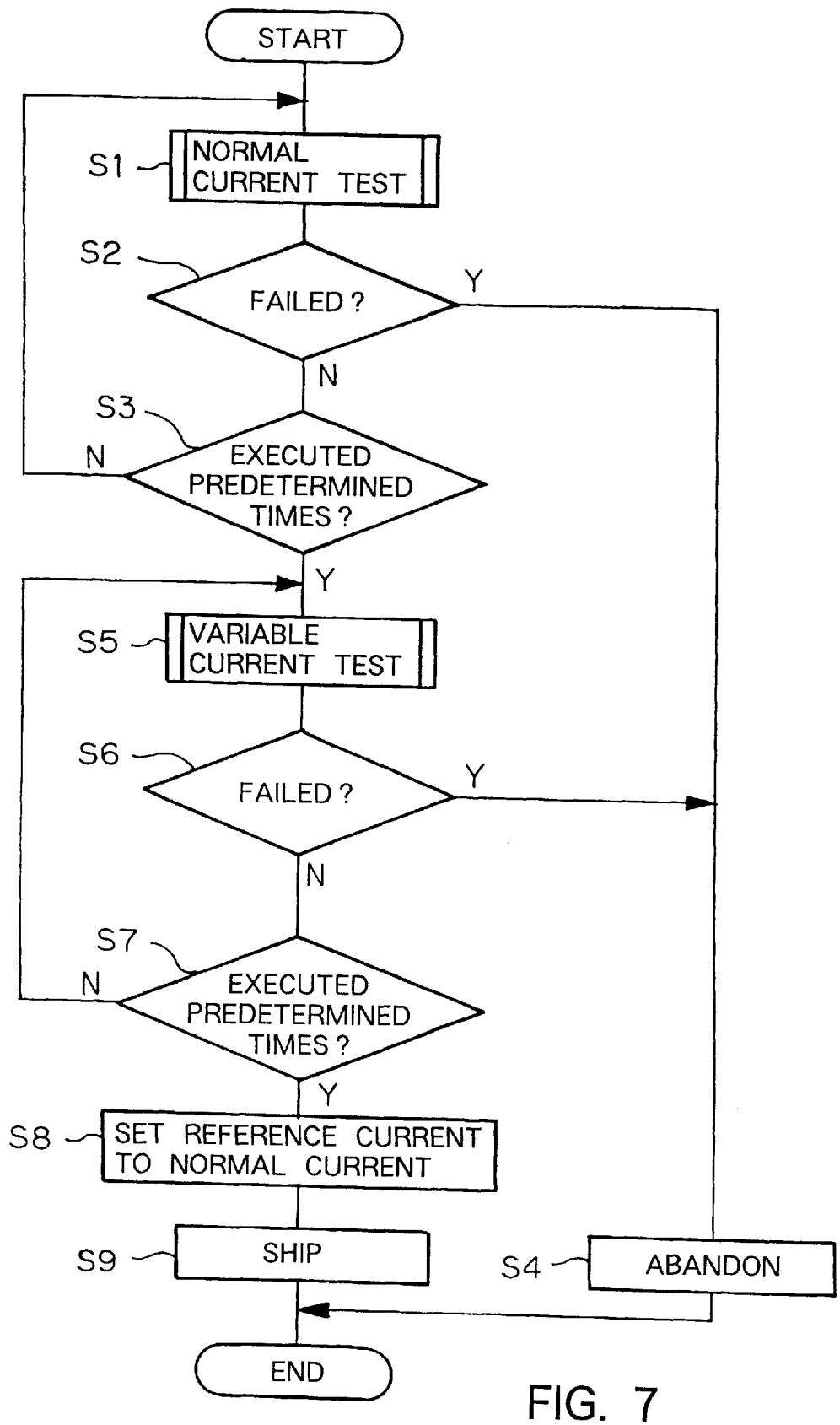
FIG. 7 is a flow chart of a main routine illustrating an operation procedure of an endurance test for the EEPROM shown in FIG. 6.

An endurance test for EEPROM 200 of the present embodiment will be described below. In the endurance test for EEPROM 200, as shown in FIG. 7, a normal current test with this reference current of reference circuit 205 set to the normal current is executed by a predetermined number of times in steps S1 to S3. If a failure occurs in the procedure of the test and is detected in step S2, then EEPROM 200 is abandoned in step S4, and the operation is ended.

Figure 8:
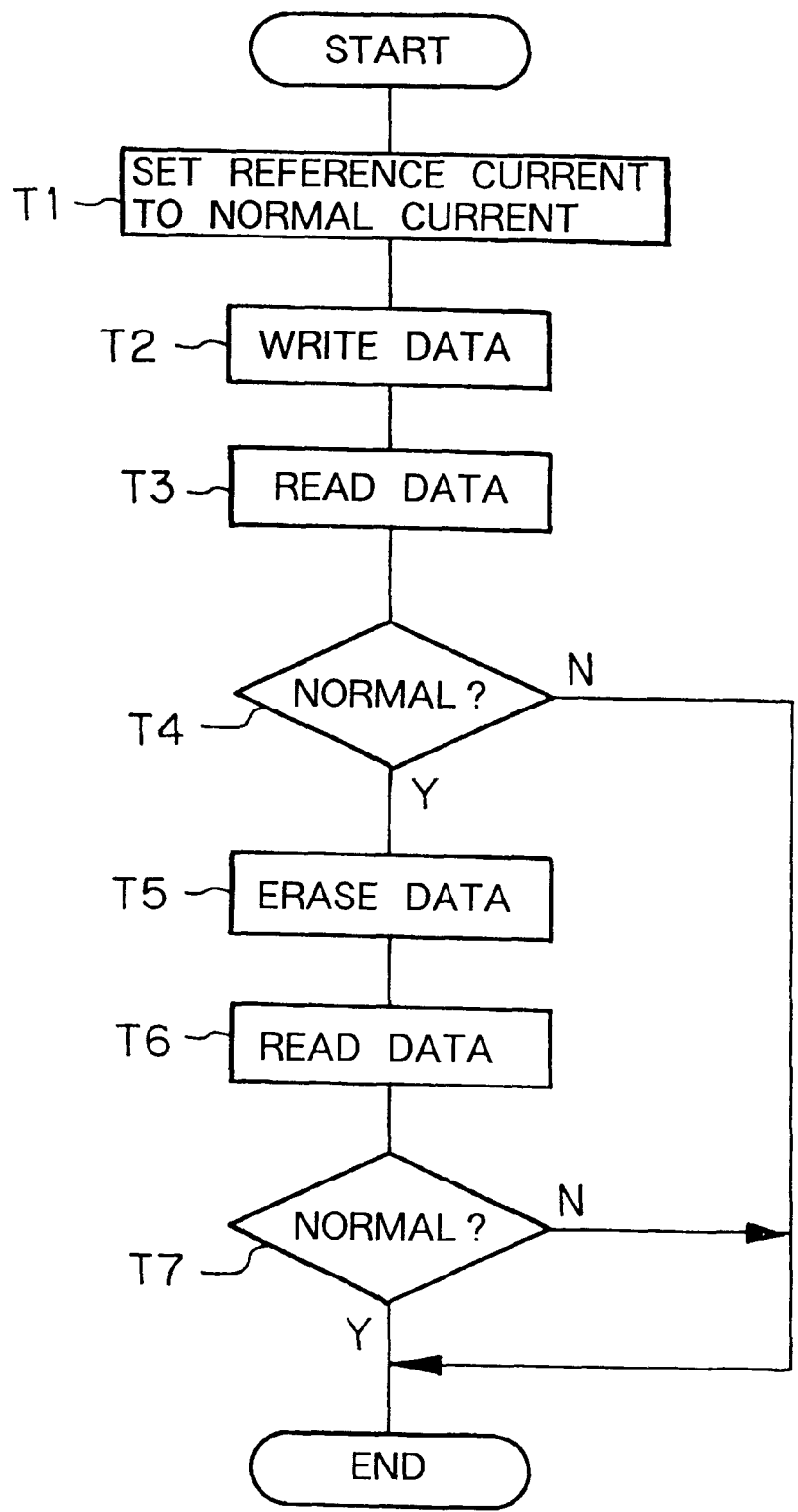
FIG. 8 is a flow chart illustrating an operation procedure of a normal current test.

FIG. 8 illustrates an operation procedure of the normal current test for reference circuit 205. In the normal current test, first in step T1, the held flag of register circuit 218 of reference switching circuit 214 is set to "0" to control only first and second transistors 211, 212 to an on-state so that the reference current to be supplied to sense amplifier 204 from reference circuit 205 may be the normal current. In this condition, write data "1" is stored into memory cell 201 in step T2, and then the recorded data is reproduced in step T3. In step T4, it is determined whether the reproduced data is "1" or not, and if the reproduced data is not "1", then it is decided that memory cell 201 under test is in failure. If memory cell 201 is in failure, then the normal current test is ended. If the reproduced data is "1" in step T4, then erase data "0" is recorded into memory cell 201 in step T5, and then in step T6, the recorded data is reproduced. In step T7, it is determined whether the reproduced data is "0" or not to determine whether memory cell 201 is in failure or not. By the processing described above, the normal current test is completed.

As described above, the normal current test illustrated in steps S1 to S3 of FIG. 7 is repeated by the predetermined number of times for all memory cells 201, and EEPROM 200 is abandoned in step S4 if failed memory cell 201 have been detected from within EEPROM 200. However, in the present embodiment, the normal current test is positioned as an aging process for memory cells 201. Accordingly, the number of repetitions in the normal current test is a fraction of the number of repetitions in a conventional endurance test.

After the normal current test of EEPROM 200 is completed without detection of any failure of memory cells 201 as described above, a variable current test wherein the reference current of reference circuit 205 is varied from the normal current to higher current and lower current is executed in step S5.

Figure 9:
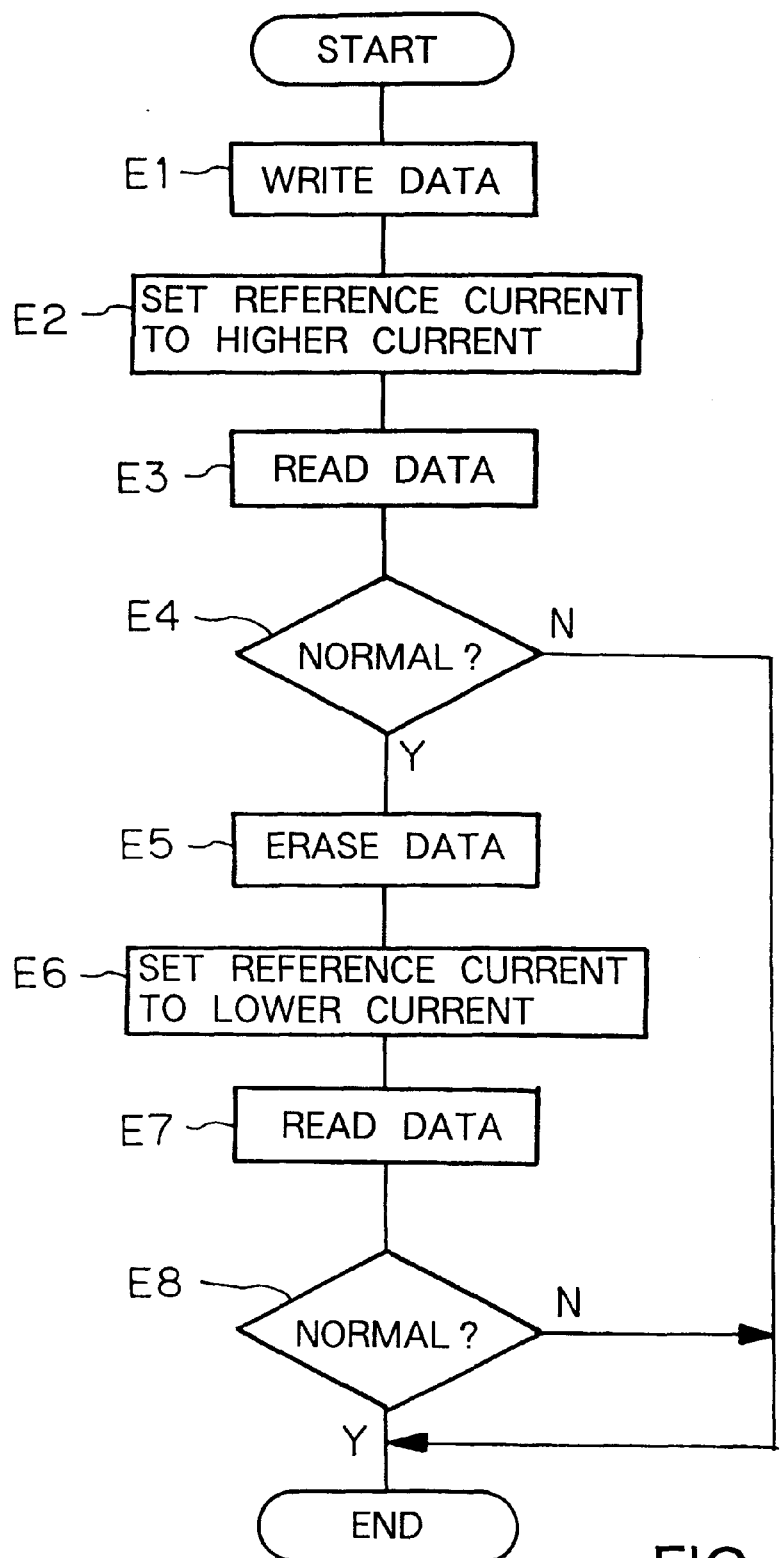
FIG. 9 is a flow chart illustrating an operation procedure of a variable current test.

FIG. 9 illustrates a detailed procedure of the variable current test. First in step E1, write data "1" is recorded into memory cell 201, and then in step E2, the flag held by first register circuit 218 of reference switching circuit 214 is set to "1" and the flag held by second register circuit 219 is set to "0" to control all of first to third transistors 211 tc 213 to an on-state so that the reference current of reference circuit 205 may be higher than the normal current. In this state, the data held by memory cell 201 is reproduced in step E3.

In step S4, it is determined whether the reproduced data is "1" or not to determine presence or absence of a failure in memory cell 201. If a failure is detected here, then the variable current test is ended immediately.

If it is determined in step E4 that memory cell 201 under test is normal, then erase data "0" is recorded into memory cell 201 in step E5, and in step E6, while the flag held by first register circuit 218 of reference switching circuit 214 is kept set to "1", the flag held by second register circuit 219 is varied to "1" to control only first transistor element 211 to an on-state so that the reference current of reference circuit 205 may be lower than the normal current. In this state, the data held by memory cell 201 is reproduced in step E7, and in step E8, it is determined whether the reproduced data is "0" or not to determine presence or absence of a failure.

As seen from FIG. 7, the variable current test described above is repeated by a predetermined number of times for all memory cells 201 in steps S5 to S7. If failed memory cell 201 is detected in step S6 in the procedure of the repetitions, then EEPROM 200 under test is abandoned in step S4.

If the normal current test and the variable current test of EEPROM 200 are completed without detection of a failure of memory cells 201 as described above, then the held flag of first register circuit 218 of reference switching circuit 214 is set to "0" to set the reference current of reference circuit 205 to the normal current in step S8, and then in step S9, EEPROM 200 is shipped.

In the present embodiment, also the number of repetitions of the variable current test described above is reduced to a fraction of the number of repetitions in a conventional endurance test. Specifically, also the total number of times of the number of repetitions of the normal current test and the number of repetitions of the variable current test is smaller than the number of repetitions in a conventional endurance test and is typically reduced to a fraction or less.

In the endurance test described above for EEPROM 200, in order to reproduce write current which is relatively high current, the reference current is set high, but in order to reproduce erase current which is relatively low current, also the reference current is set low. In short, since data reproduction is executed with a reduced current margin, failed memory cell 201 can be detected quickly. Consequently, the number of repetitions of the endurance test can be reduced and the time required for the test can be reduced.

In the variable current test, the reference current must be varied to the higher current or the lower current each time write current and erase current are reproduced from memory cell 201, and therefore, for an inspection operation for one memory cell 201, a time longer than the time required for an inspection operation in the conventional endurance test is required. However, in the endurance test in the embodiment described above, the normal current test similar to that in the conventional endurance test is executed to perform aging processing for memory cells 201, and the variable current test wherein the reference current is varied is executed after the aging processing is completed. Therefore, reduction of the time required for the endurance test can be achieved better. Besides, since reference switching circuit 214 for varying the reference current to the higher current and the lower current is built in EEPROM 200, there is no necessity for preparing an apparatus for exclusive use for supplying reference current of the higher and lower levels in EEPROM 200, and an endurance test can be executed simply.

Furthermore, EEPROM 200 described above includes three transistors 211 to 213 connected in parallel as the transistor elements for determining the reference current of reference circuit 205, and reference switching circuit 214 changes over the reference current among the normal current, higher current and lower current by varying the number of those of transistors 211 to 213 to which the bias voltage from bias power supply 215 is to be applied. Therefore, EEPROM 200 can vary the reference current to a desired level with certainty with the simple structure.

The present invention is not limited to the specific embodiment described above, and changes and variations may be made without departing from the spirit or scope thereof. For example, although sense amplifier 204 in the embodiment described above compares the output current of memory cell 201 with the reference current of reference circuit 205 to reproduce binary data, it is otherwise possible for the sense amplifier to compare a held voltage of a memory cell with a reference voltage of the reference circuit to reproduce binary data. In this case, reference circuit 205 selectively generates a reference voltage from among a normal voltage, another voltage higher than the normal voltage and a further voltage lower than the normal voltage. In addition, in an endurance test, a variable voltage test wherein the reference voltage is varied in place of the reference current used in the above-described variable current test is executed. Consequently, the voltage margin in data reproduction can be reduced. Accordingly, a failed memory cell can be detected rapidly and the number of repetitions of the endurance test can be reduced.

In the embodiment described above, the endurance test involves the variable current test executed by a predetermined number of times after the normal current test is executed by a predetermined number of times. Alternatively, only the variable current test is executed by a predetermined number of times as the endurance test.

In the embodiment described above, the endurance test involves the variable current test executed by a predetermined number of times after the normal current test is executed by a predetermined number of times. Alternatively, however, data writing/erasure may be executed after the reference current is varied to the higher current and the lower current.

The foregoing description presumes that an EEPROM is abandoned if it includes at least one failed memory cell. Alternatively, however, if an EEPROM includes a number of failed memory cells which remains within a tolerance, then the EEPROM may be shipped after it is set so that the failed memory cells may be disabled from being used.

While preferred embodiments of the present invention have been described using specific terms, such description is for illustrative purposes only, and it is to be understood that changes and variations may be made without departing from the spirit or scope of the following claims.

What is claimed is:

1. A memory inspection method for inspecting a nonvolatile memory device comprising data holding means for holding binary data and outputting, upon reading therefrom, a first value of an electrical quantity or a second value of the electrical quantity smaller than the first value in response to a value of the binary data; reference generation means for generating a reference value of the electrical quantity smaller than the first value but larger than the second value; data reproduction means for comparing an output value of said data holding means with the reference value to reproduce binary data; and reference switching means for selectively switching the reference value to be generated by said reference generation means to a normal reference value which is a value to be generated normally, a higher reference value which is higher than the normal value or a lower value which is lower than the normal value, wherein the electric quantity is electric current; comprising:

changing a state of said data holding means to a state corresponding to the first value, setting the reference value to the higher reference value and reproducing the binary data held by said data holding means; and changing the state of said data holding means to another state corresponding to the second value, setting the reference value to the lower reference value, and reproducing the binary data held by said data holding means.

2. A memory inspection method for inspecting a nonvolatile memory device comprising a memory cell for holding binary data and outputting, upon reading therefrom, first current or second current which is lower than the first current in response to the binary data; a reference circuit for generating reference current lower than the first current but higher than the second current; a sense amplifier for comparing output current of said memory cell with the reference current to reproduce binary data; and a reference switching circuit for selectively switching the reference current to be generated by said reference circuit to a normal current, a higher current which is higher than the normal current or a lower current which is lower than the normal current; comprising:

changing a state of said memory cell to a state corresponding to the first current, setting the reference current to the higher current and reproducing the binary data held by said memory cell by means of said sense amplifier; and changing the state of said memory cell to another state corresponding to the second current, setting the reference current to the lower current and reproducing the binary data held by said memory cell by means of said sense amplifier.

3. A memory inspection method for inspecting a nonvolatile memory device comprising: a memory cell for holding binary data and outputting, upon reading therefrom, first current or second current which is lower than the first current in response to the binary data; a reference circuit for generating reference current lower than the first current but higher than the second current; a sense amplifier for comparing output current of said memory cell with the reference current to reproduce binary data; a reference switching circuit for selectively switching the reference current to be generated by said reference circuit to a normal current, a higher current which is higher than the normal current or a lower current which is lower than the normal current; wherein said reference circuit includes three transistors connected in parallel for producing the reference current, and a bias power supply for generating a bias voltage to be applied to gates of said transistors, and said reference switching circuit includes a changeover switch for varying the number of those of said transistors to which the bias voltage is to be applied from said bias voltage; comprising:

changing a state of said memory cell to a state corresponding to the first current, controlling the number of those of said transistors to which the bias voltage is to be applied to three and reproducing the binary data held by said memory cell by means of said sense amplifier; and changing the state of said memory cell to another state corresponding to the second current, controlling the number of those of said transistors to which the bias voltage is to be applied to one and reproducing the binary data held by said memory cell by means of said sense amplifier.

* * * * *